(12) United States Patent
Hao et al.

(10) Patent No.: US 10,978,535 B2
(45) Date of Patent: Apr. 13, 2021

(54) PIXEL CIRCUIT, DISPLAY PANEL AND DISPLAY DEVICE

(71) Applicant: BOE Technology Group Co., Ltd., Beijing (CN)

(72) Inventors: Xueguang Hao, Beijing (CN); Xinyin Wu, Beijing (CN); Yongda Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 162 days.

(21) Appl. No.: 16/342,039

(22) PCT Filed: Aug. 8, 2018

(86) PCT No.: PCT/CN2018/103347
§ 371 (c)(1),
(2) Date: Apr. 15, 2019

(87) PCT Pub. No.: WO2019/114327
PCT Pub. Date: Jun. 20, 2019

(65) Prior Publication Data
US 2021/0036083 A1 Feb. 4, 2021

(30) Foreign Application Priority Data
Dec. 14, 2017 (CN) .......................... 201721749337.8

(51) Int. Cl.
*H01L 27/32* (2006.01)
*G09G 3/3233* (2016.01)

(52) U.S. Cl.
CPC ....... *H01L 27/3265* (2013.01); *G09G 3/3233* (2013.01); *G09G 2300/0452* (2013.01); *G09G 2320/0233* (2013.01); *H01L 2227/323* (2013.01)

(58) Field of Classification Search
CPC .... G09G 3/30–3291; G09G 2300/0452; H01L 27/3241–3279; H01L 27/3262;
(Continued)

(56) References Cited

U.S. PATENT DOCUMENTS

2008/0030443 A1   2/2008   Yamashita et al.
2009/0284515 A1   11/2009  Tsuge
(Continued)

FOREIGN PATENT DOCUMENTS

| CN | 101159119 A | 4/2008 |
| CN | 106920515 A | 7/2017 |
| CN | 207781601 U | 8/2018 |

OTHER PUBLICATIONS

International Search Report for PCT/CN2018/103347 dated Oct. 3, 2018.

*Primary Examiner* — Sanjiv D. Patel
(74) *Attorney, Agent, or Firm* — Arent Fox LLP; Michael Fainberg

(57) ABSTRACT

The disclosure discloses a pixel circuit, a display panel, and a display device. The display device comprises: a light emitting device with a second terminal coupled to a low voltage signal line; a drive thin film transistor with a second terminal coupled to a first terminal of the light emitting device; a light emitting control thin film transistor with a first terminal coupled to a high voltage signal line, and a second terminal coupled to a first terminal of the drive thin film transistor; a switch thin film transistor, which controls data voltage to be written into a control terminal of the drive thin film transistor; a reset thin film transistor, which resets potential of the control terminal of the drive thin film transistor; and a storage capacitor, coupled to the control terminal and the second terminal of the drive thin film transistor.

18 Claims, 3 Drawing Sheets

(58) Field of Classification Search
CPC ......... H01L 27/3265; H01L 2251/5338; H01L 29/41733
See application file for complete search history.

(56) References Cited

U.S. PATENT DOCUMENTS

| | | | |
|---|---|---|---|
| 2010/0309178 A1* | 12/2010 | Tomida | G09G 3/3233 345/205 |
| 2014/0300281 A1* | 10/2014 | Chaji | G09G 3/3266 315/161 |
| 2018/0218681 A1* | 8/2018 | Cai | G09G 3/3258 |

* cited by examiner

PIXEL CIRCUIT, DISPLAY PANEL AND DISPLAY DEVICE

CROSS-REFERENCE TO RELATED APPLICATIONS

This application is a National Stage of International Application No. PCT/CN2018/103347, filed Aug. 30, 2018, which claims priority to Chinese Patent Application No. 201721749337.8, filed Dec. 14, 2017, both of which are hereby incorporated by reference in their entireties.

FIELD

This disclosure relates to the field of display technologies, and particularly to a pixel circuit, a display panel and a display device.

BACKGROUND

More and more organic electroluminescent display devices (OLEDs) are applied to display screens of display devices. Compared with a liquid crystal display (LCD) screen, an OLED screen has many advantages, such as high brightness, high color gamut, high contrast, and thinness, but the OLED screen currently applied on the market has many problems due to the structures of the pixel drive circuit and the pixel arrangement, thus resulting in poor display quality.

SUMMARY

In a first aspect, the embodiments of the disclosure provide a pixel circuit, including: a light emitting device, where a second terminal of the light emitting device is coupled to a low voltage signal line; a drive thin film transistor, configured to supply a drive current to the light emitting device, where a second terminal of the drive thin film transistor is coupled to a first terminal of the light emitting device; a light emitting control thin film transistor, configured to control the light emitting device to emit light, where a first terminal of the light emitting control thin film transistor is coupled to a high voltage signal line, and a second terminal of the light emitting control thin film transistor is coupled to a first terminal of the drive thin film transistor; a switch thin film transistor, configured to control a data voltage to be written into a control terminal of the drive thin film transistor; a reset thin film transistor, configured to reset a potential of the control terminal of the drive thin film transistor; and a storage capacitor, where a first terminal of the storage capacitor is coupled to the control terminal of the drive thin film transistor, and a second terminal of the storage capacitor is coupled to the second terminal of the drive thin film transistor.

Optionally, in the pixel circuit above according to the embodiments of the disclosure, a control terminal of the light emitting control thin film transistor is coupled to a light emitting control signal line.

Optionally, in the pixel circuit above according to the embodiments of the disclosure, a first terminal of the switch thin film transistor is coupled to a data signal line, a second terminal of the switch thin film transistor is coupled to the control terminal of the drive thin film transistor, and a control terminal of the switch thin film transistor is coupled to a scan signal line.

Optionally, in the pixel circuit above according to the embodiments of the disclosure, a first terminal of the reset thin film transistor is coupled to an initial voltage signal line, and a second terminal of the reset thin film transistor is coupled to the second terminal of the switch thin film transistor, and a control terminal of the reset thin film transistor is coupled to a reset signal line.

Optionally, in the pixel circuit above according to the embodiments of the disclosure, the first terminal of the drive thin film transistor is a source or a drain; and the first terminal of the light emitting device is an anode.

Optionally, in the pixel circuit above according to the embodiments of the disclosure, the pixel circuit further includes a brightness enhancement capacitor, where a first terminal of the brightness enhancement capacitor is coupled to the high voltage signal line, and a second terminal of the brightness enhancement capacitor is coupled to the first terminal of the light emitting device.

Optionally, in the pixel circuit above according to the embodiments of the disclosure, the brightness enhancement capacitor includes: a first metal pattern, a second metal pattern, and an insulation layer located between the first metal pattern and the second metal pattern; where the first metal pattern is located above the second metal pattern.

Optionally, in the pixel circuit above according to the embodiments of the disclosure, the brightness enhancement capacitor further includes: a third metal pattern located below the second metal pattern, and an insulation layer located between the second metal pattern and the third metal pattern.

Optionally, in the pixel circuit above according to the embodiments of the disclosure, the second metal pattern, and a source or a drain of a thin film transistor are at the same layer and made of the same material; and the third metal pattern and a gate of the thin film transistor are at the same layer and made of the same material.

Optionally, in the pixel circuit above according to the embodiments of the disclosure, the second terminal of the drive thin film transistor is coupled to the first terminal of the light emitting device through a contact hole; and a spacing between the first metal pattern and the contact hole ranges from 2 μm to 5 μm.

In a second aspect, the embodiments of the disclosure further provide a display panel, including the above pixel circuit, where the pixel circuit includes a red sub-pixel circuit, a green sub-pixel circuit, and a blue sub-pixel circuit.

Optionally, in the pixel circuit above according to the embodiments of the disclosure, a capacitance difference between any two of brightness enhancement capacitors of the red sub-pixel circuit, the green sub-pixel circuit and the blue sub-pixel circuit is less than 5% of a capacitance of any one of the brightness enhancement capacitors of the red sub-pixel circuit, the green sub-pixel circuit and the blue sub-pixel circuit.

In a third aspect, the embodiments of the disclosure further provide a display device, including the above display panel.

DETAILED DESCRIPTION OF THE EMBODIMENTS

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

Unless otherwise defined, the technical terms or scientific terms as used in the disclosure should be the general meanings understood by those ordinary skilled in the art to which the disclosure belongs. The "first", "second" and similar words as used in the disclosure do not represent any order, number or importance, but are only used to distinguish the different constituent parts. The "include" or "contain" or similar word means that the element or object appearing before this word encompasses the elements or objects and their equivalents recited after this word, but not exclude other elements or objects. The "connect" or "connect with" or similar word is not limited to the physical or mechanical connection, and can include the electrical connection, regardless of whether it is direct or indirect. The "up", "down", "left", "right" or the like is only used to represent the relative position relationship, and when the absolute position of the described object changes, the relative position relationship may also change accordingly.

In the embodiments of the disclosure, an organic light emitting transistor is abbreviated as an OLED. Correspondingly, a drive thin film transistor is abbreviated as TFT01, a light emitting control thin film transistor is abbreviated as TFT02, a reset thin film transistor is abbreviated as TFT03, a switch thin film transistor is abbreviated as TFT04, a storage capacitor is abbreviated as C05, a brightness enhancement capacitor is abbreviated as C06, and a light emitting device is abbreviated as D07, a first capacitor is abbreviated as C1 and a second capacitor is abbreviated as C2. Further, in the embodiments of the disclosure, a source and a drain, relatively speaking, are mutually replaceable. For example, in the case where the source is replaced with the drain, the drain is also replaced with the source.

Figure 1:
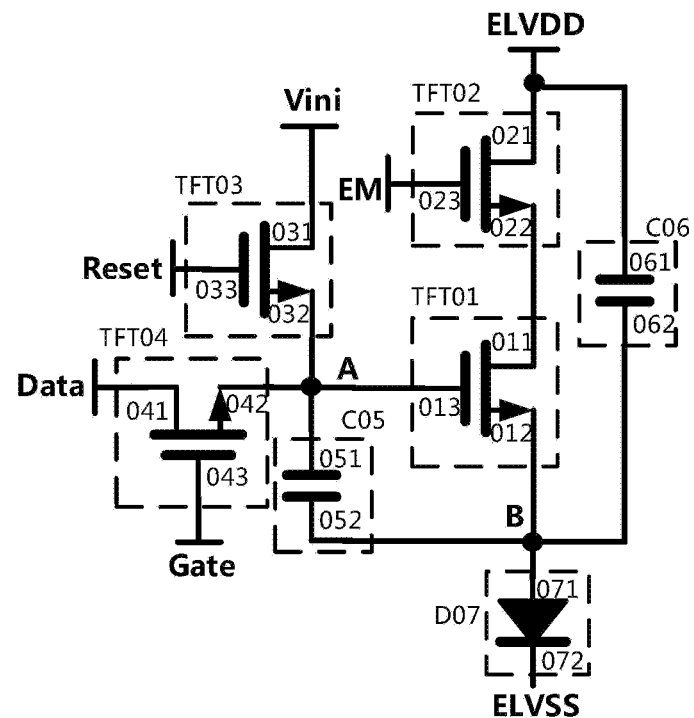
FIG. 1 is a schematic structural diagram of a pixel circuit according to the embodiments of the disclosure.

The embodiments of the disclosure provide a pixel circuit, as illustrated in FIG. 1, including: a light emitting device D07, where a second terminal 072 of the light emitting device D07 is coupled to a low voltage signal line ELVSS; a drive thin film transistor TFT01, configured to supply a drive current to the light emitting device D07, where a second terminal 012 of the drive thin film transistor TFT01 is coupled to a first terminal 071 of the light emitting device D07; a light emitting control thin film transistor TFT02, configured to control the light emitting device to emit light, where a first terminal 021 of the light emitting control thin film transistor TFT02 is coupled to a high voltage signal line ELVDD, and a second terminal 022 of the light emitting control thin film transistor TFT02 is coupled to a first terminal 011 of the drive thin film transistor TFT01; a switch thin film transistor TFT04, configured to control data voltage to be written into a control terminal 013 of the drive thin film transistor TFT01; a reset thin film transistor TFT03, configured to reset a potential of the control terminal 013 of the drive thin film transistor TFT01; and a storage capacitor C05, where a first terminal 051 of the storage capacitor C05 is coupled to the control terminal 013 of the drive thin film transistor TFT01, and a second terminal 052 of the storage capacitor C05 is coupled to the second terminal 012 of the drive thin film transistor TFT01.

Particularly, in the pixel circuit above according to the embodiments of the disclosure, the reset thin film transistor TFT03 resets the control terminal 013 of the drive thin film transistor TFT01 before writing a data voltage signal, thus stabilizing the potential of the control terminal 013 of the drive thin film transistor TFT01 and thereby effectively improving the reliability of the pixel circuit.

Optionally, in the pixel circuit above according to the embodiments of the disclosure, as illustrated in FIG. 1, a control terminal 023 of the light emitting control thin film transistor TFT 02 is coupled to a light emitting control signal line EM.

Optionally, in the pixel circuit above according to the embodiments of the disclosure, as illustrated in FIG. 1, a first terminal 041 of the switch thin film transistor TFT04 is coupled to a data signal line Data, and a second terminal 042 of the switch thin film transistor TFT04 is coupled to the control terminal 013 of the drive thin film transistor TFT01, and a control terminal 043 of the switch thin film transistor TFT04 is coupled to a scan signal line Gate.

Optionally, in the pixel circuit above according to the embodiments of the disclosure, as illustrated in FIG. 1, a first terminal 031 of the reset thin film transistor TFT03 is coupled to an initial voltage signal line Vini, a second terminal 032 of the reset thin film transistor TFT03 is coupled to the second terminal 042 of the switch thin film transistor TFT04, and a control terminal 033 of the reset thin film transistor TFT03 is coupled to a reset signal line Reset.

Optionally, in the pixel circuit above according to the embodiments of the disclosure, as illustrated in FIG. 1, the first terminal 011 of the drive thin film transistor TFT01 is a source or a drain, correspondingly, the second terminal 012 is a drain or a source; the first terminal 071 of the light emitting device D07 is an anode, and correspondingly, the second terminal 072 of the light emitting device D07 is a cathode.

In the embodiments of the disclosure, the drive thin film transistor TFT01, the light emitting control thin film transistor TFT02, the reset thin film transistor TFT03, and the switch thin film transistor TFT04 may be N-type thin film transistors or P-type thin film transistors; if the drive thin film transistor TFT01, the light emitting control thin film transistor TFT02, the reset thin film transistor TFT03, and the switch thin film transistor TFT04 are N-type thin film transistors, then when the reset signal line Reset, the scan signal line Gate, and the light emitting control signal line EM input a high voltage signal, the drive thin film transistor TFT01, the light emitting control thin film transistor TFT02, the reset thin film transistor TFT03, and the switch thin film transistor TFT04 are turned on; and if the drive thin film transistor TFT01, the light emitting control thin film transistor TFT02, the reset thin film transistor TFT03, and the switch thin film transistor TFT04 are P-type thin film transistors, then when the reset signal line Reset, the scan signal line Gate, and the light emitting control signal line EM input a low voltage signal, the drive thin film transistor TFT01, the light emitting control thin film transistor TFT02, the reset thin film transistor TFT03, and the switch thin film transistor TFT04 are turned on.

Optionally, in the pixel circuit above according to the embodiments of the disclosure, as illustrated in FIG. 1, the pixel circuit may further include a brightness enhancement capacitor C06, where a first terminal 061 of the brightness enhancement capacitor C06 is coupled to the high voltage signal line ELVDD, and a second terminal 062 of the brightness enhancement capacitor C06 is coupled to the first terminal 071 of the light emitting device D07.

Particularly, in the pixel circuit above according to the embodiments of the disclosure, since the brightness enhancement capacitor C06 is added, the light emitting brightness of the light emitting device D07 and the display uniformity of the display panel can be effectively improved.

Figure 2:
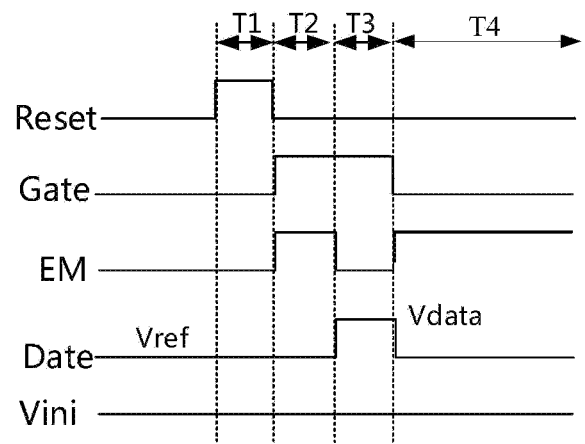
FIG. 2 is an operation time sequence chart of a pixel circuit according to the embodiments of the disclosure.

The operation principle of the pixel circuit above according to the embodiments of the disclosure will be described in detail below with reference to an operation time sequence diagram illustrated in FIG. 2, in which, as an example, all of the thin film transistors in the pixel circuit are N-type thin film transistors. The particular operation principle is as follows.

① In the T1 time period, the reset signal line Reset inputs a high level voltage signal, the reset thin film transistor TFT03 is turned on, the potential of the node A is reset to the potential of the initial voltage signal line Vini, and the reset operation of the node A is completed. During this period of time, the light emitting control signal line EM and the scan signal line Gate input a low level voltage signal, and the light emitting control thin film transistor TFT02 and the switch thin film transistor TFT04 are in a turn-turn-off state.

② In the T2 time period, the reset signal line Reset inputs a low level voltage signal, and the reset thin film transistor TFT03 is in a turn-turn-off state. The light emitting control signal line EM and the scan signal line Gate input a high level voltage signal, the light emitting control thin film transistor TFT02 and the switch thin film transistor TFT04 are turned on, the node A writes the reference potential Vref input from the data signal line Data, since the drive thin film transistor TFT01 is in the turn-off state, the voltage of the node B finally becomes Vref−Vth, where Vth is the threshold voltage of the drive thin film transistor TFT01, and the operation of writing the threshold voltage is completed.

③ In the T3 time period, the reset signal line Reset remains inputting a low level voltage signal, and the reset thin film transistor TFT03 remains in the turn-off state. The light emitting control signal line EM inputs a low level voltage signal, and the light emitting control thin film transistor TFT02 is in a turn-turn-off state. The scan signal line Gate remains inputting a high level voltage signal, the switch thin film transistor TFT04 remains being turned on; and the node A writes the data potential Vdata input from the data signal line Data.

When only the storage capacitor C05 exists, the potential of the node B eventually changes from Vref−Vth to C05*(Vdata−Vref)/(C05+$C_{OLED}$)+Vref−Vth due to the coupling effect of the storage capacitor C05 and the voltage division effect of the capacitor $C_{OLED}$ of the light emitting device D07, and the operation of writing the data signal is completed.

When the brightness enhancement capacitor exists, the potential of the node B eventually changes from Vref−Vth to C05*(Vdata−Vref)/(C06+C05+$C_{OLED}$)+Vref−Vth due to the coupling effect of the storage capacitor C05 and the voltage division effect of the brightness enhancement capacitor and the capacitance $C_{OLED}$ of the light emitting device D07, and the operation of writing the data signal is completed.

③ In the T4 time period, the reset signal line Reset remains inputting a low-level voltage signal, and the reset thin film transistor TFT03 remains in the turn-off state. The scan signal line Gate inputs a low-level voltage signal, and the switch thin film transistor TFT04 is in a turn-off state. The light emitting control signal line EM inputs a high level voltage signal, and the light emitting control thin film transistor TFT02 is turned on. At this time, the current flowing through the drive thin film transistor TFT01 is: Ids=½k(Vgs−Vth)²=½K($V_A$−$V_B$−Vth)²; where k=μCoxW/L; μ is an ion mobility, W is a channel width, Cox is a thin film oxide capacitance, and L is a channel length.

When only the storage capacitor C05 exists:

$$Ids = \frac{1}{2}k\left(Vdata - \left(\frac{CO5}{CO5+C_{OLED}}(Vdata-Vref)+Vref-Vth\right)-Vth\right)^2 =$$
$$\frac{1}{2}k\left(Vdata-Vref-\frac{CO5}{CO5+C_{OLED}}(Vdata-Vref)\right)^2 =$$
$$\frac{1}{2}k\left(\frac{CO5+C_{OLED}}{CO5+C_{OLED}}(Vdata-Vref)-\frac{CO5}{CO5+C_{OLED}}(Vdata-Vref)\right)^2 =$$
$$\frac{1}{2}k\left(\frac{C_{OLED}}{CO5+C_{OLED}}(Vdata-Vref)\right)^2$$

When the brightness enhancement capacitor C06 exists:

$$Ids = \frac{1}{2}$$
$$k\left(Vdata - \left(\frac{CO5}{CO5+CO6+C_{OLED}}(Vdata-Vref)+Vref-Vth\right)-Vth\right)^2$$
$$= \frac{1}{2}k\left(Vdata-Vref-\frac{CO5}{CO5+CO6+C_{OLED}}(Vdata-Vref)\right)^2 =$$
$$\frac{1}{2}k\left(\frac{CO5+CO6+C_{OLED}}{CO5+CO6+C_{OLED}}(Vdata-Vref)-\frac{CO5}{CO5+CO6+C_{OLED}}(Vdata-Vref)\right)^2 =$$
$$\frac{1}{2}k\left(\frac{CO6+C_{OLED}}{CO5+CO6+C_{OLED}}(Vdata-Vref)\right)^2$$

By comparing the above two equations, it can be seen that the current flowing through the drive thin film transistor TFT01 is larger when the brightness enhancement capacitor C06 exists, and therefore, the light emitting brightness of the light emitting device D07 can be improved.

Figure 3:
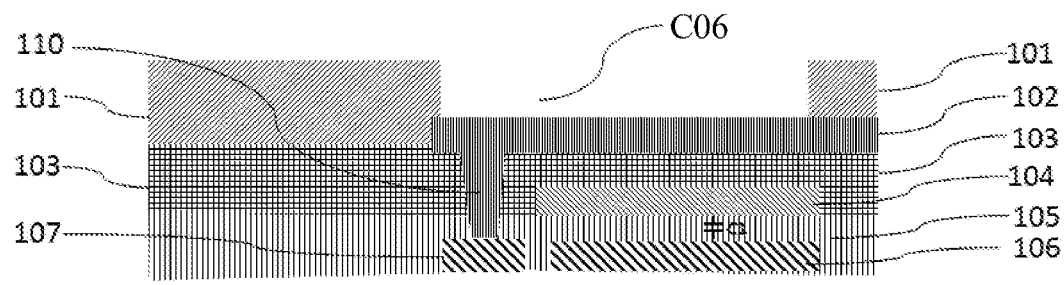
FIG. 3 is a schematic structural diagram of a brightness enhancement capacitor in a pixel circuit according to the embodiments of the disclosure.

Optionally, in the pixel circuit above according to the embodiments of the disclosure, as illustrated in FIG. 3, a structure of the brightness enhancement capacitor C06 includes: a first metal pattern 104, a second metal pattern 106, and a first inorganic insulation layer pattern 105 located between the first metal pattern 104 and the second metal pattern 106, where the first metal pattern 104 is located above the second metal pattern 106. The first capacitor C1 formed by the first metal pattern 104 and the second metal pattern 106 is considered as the brightness enhancement capacitor C06.

Optionally, in the pixel circuit above according to the embodiments of the disclosure, as illustrated in FIG. 3, the second metal pattern 106, and a source or a drain 107 of the thin film transistor are at the same layer and made of the same material, that is, fabricated via the same patterning process.

Particularly, taking the structure illustrated in FIG. 3 as an example, the fabrication process is as follows.

In the first operation, deposit a second metal layer on a glass substrate or a plastic substrate on which another film layer has been formed, and form a pattern of the source or drain 107, and the second metal pattern 106 of the brightness enhancement capacitor C06 by exposure, etching, and development; where the second metal layer is generally made of a metal material such as aluminum, molybdenum or titanium, or an alloy material of any two of the above three materials.

In the second operation, deposit a first inorganic insulation layer on the second metal layer, and form a first inorganic layer contact hole and a first inorganic insulation layer pattern 105 in the first inorganic insulation layer by a process similar to that of the first operation; where the first inorganic insulation layer is generally made of a non-metal material such as silicon nitride, silicon oxide or silicon oxynitride.

In the third operation, deposit a first metal layer on the first inorganic insulation layer, and form the first metal pattern 104 of the brightness enhancement capacitor C06 by substantially the same process as described above.

In the fourth operation, form an organic layer contact hole in an organic layer 103 by deposition, exposure, and development processes, where a contact hole 110 includes the first inorganic layer contact hole and the organic layer contact hole, and the organic layer contact hole is located above the first inorganic layer contact hole.

In the fifth operation, form an anode layer pattern 102 by deposition, exposure, etching, and development processes.

In the sixth operation, form a pixel definition layer pattern 101 by deposition, exposure, and development processes.

Particularly, in the pixel circuit above according to the embodiments of the disclosure, as illustrated in FIG. 3, the second terminal (that is, the source or the drain) of the drive thin film transistor TFT01 is coupled to the first terminal (that is, the anode 102) of the light emitting device D07 through the contact hole 110; the spacing between the first metal pattern 104 of the brightness enhancement capacitor C06 and the contact hole 110 may range from 2 μm to 5 μm.

Figure 4:
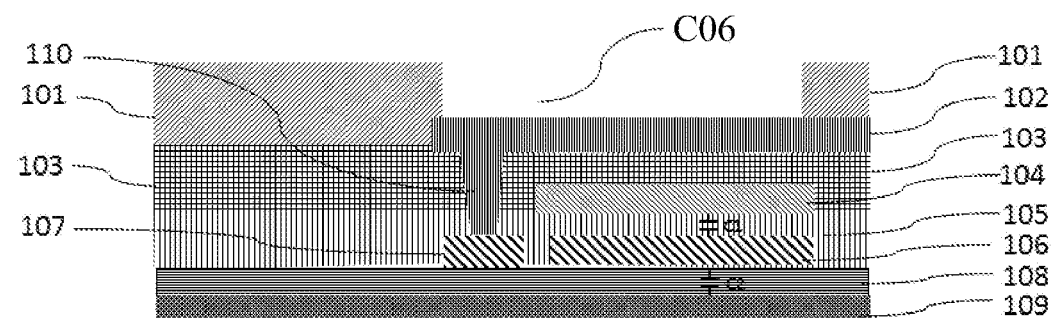
FIG. 4 is another schematic structural diagram of a brightness enhancement capacitor in a pixel circuit according to the embodiments of the disclosure.

Optionally, in the pixel circuit above according to the embodiments of the disclosure, as illustrated in FIG. 4, the structure of the brightness enhancement capacitor C06 further includes: a third metal pattern 109 located below the second metal pattern 106, and a second inorganic insulation layer pattern 108 located between the second metal pattern 106 and the third metal pattern 109. The first metal pattern 104 and the second metal pattern 106 constitute a first capacitor C1, the third metal pattern 109 and the second metal pattern 106 constitute a second capacitor C2, and the first capacitor C1 and the second capacitor C2 are connected in parallel as the brightness enhancement capacitor C06, thus increasing the capacitance value of the brightness enhancement capacitor C06, and further improving the display brightness.

Optionally, in the pixel circuit above according to the embodiments of the disclosure, the third metal pattern 109 and a gate of the thin film transistor are at the same layer and made of the same material, that is, fabricated via the same patterning process.

Particularly, taking the structure illustrated in FIG. 4 as an example, the fabrication process is as follows.

In the first operation, deposit a third metal layer on the glass or plastic substrate on which another film layer has been formed, and form the third metal pattern 109 of the brightness enhancement capacitor C06 and a gate pattern by exposure, etching, and development; where the third metal layer is generally made of a metal material such as aluminum, molybdenum or titanium, or an alloy material of any two of the above three materials.

In the second operation, deposit a second inorganic insulation layer on the third metal layer, and form a second inorganic insulation layer pattern 108 of the brightness enhancing capacitor C06 by a process similar to that of the first operation, where the second inorganic insulation layer is generally made of a non-metallic material such as silicon nitride, silicon oxide or silicon oxynitride.

In the third operation, deposit a second metal layer on the second inorganic insulation layer, and form a pattern of the source or drain 107, and the second metal pattern 106 of the brightness enhancement capacitor C06 by exposure, etching, and development, where the second metal layer is generally made of a metal material such as aluminum, molybdenum or titanium, or an alloy material of any two of the above three materials.

In the fourth operation, deposit a first inorganic insulation layer on the second metal layer, and form a first inorganic layer contact hole and a first inorganic insulation layer pattern 105 in the first inorganic insulation layer by a process substantially the same as that of the first operation, where the first inorganic insulation layer is generally made of a non-metal material such as silicon nitride, silicon oxide or silicon oxynitride.

In the fifth operation, deposit a first metal layer on the first inorganic insulation layer, and form the first metal pattern 104 of the brightness enhancement capacitor C06 by substantially the same process as described above.

In the sixth operation, form an organic insulation layer contact hole in an organic layer 103 by deposition, exposure, and development, where a contact hole 110 includes the first inorganic layer contact hole and the organic layer contact hole, and the organic layer contact hole is located above the first inorganic layer contact hole.

In the seventh operation, form an anode layer pattern 102 by deposition, exposure, etching, and development.

In the eighth operation, form a pixel definition layer 101 by deposition, exposure, and development.

Particularly, in the pixel circuit above according to the embodiments of the disclosure, as illustrated in FIG. 4, the second terminal (that is, the source or the drain) of the drive thin film transistor TFT01 is coupled to the first terminal (that is, the anode 102) of the light emitting device D07 through the contact hole 110; where the spacing between the first metal pattern 104 of the brightness enhancement capacitor C06 and the contact hole 110 may range from 2 μm to 5 μm.

Figure 5:
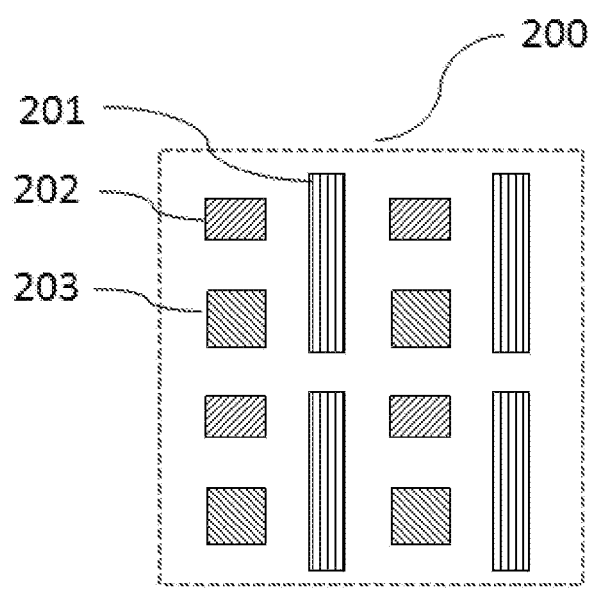
FIG. 5 is a schematic structural diagram of an arrangement of pixel circuits in a display panel according to the embodiments of the disclosure.

Based upon the same inventive concept, the embodiments of the disclosure further provide a display panel 200, including the pixel circuit above according to the embodiments of the disclosure; as illustrated in FIG. 5, the pixel circuit includes a blue sub-pixel circuit 201, a red sub-pixel circuit 202, and a green sub-pixel circuit 203.

Particularly, in the display panel above according to the embodiments of the disclosure, in the three sub-pixel circuits, contact holes 110, through which second terminals (that is, the sources or the drains) of drive thin film transistors TFT01 are coupled to first terminals (that is, the anodes 102) of light emitting devices D07, are located at different positions, and a line of centers of the contact holes 110 is not on an imaginary line.

Particularly, in the display panel above according to the embodiments of the disclosure, overlapping areas of first metal patterns 104 and second metal patterns 106 of brightness enhancement capacitors C06 of the three sub-pixel circuits are substantially the same. Further, in order to make a first metal pattern 104 and a second metal pattern 106 of a brightness enhancement capacitor C06 have a large overlapping area and prevent short circuit between the first metal pattern 104 and a drain 107 of the drive thin film transistor TFT01 caused by the overlapping of the first metal pattern 104 of the brightness enhancement capacitor C06 and a contact hole 110 at the same time, the overlapping parts of the first metal patterns 104 and the second metal patterns 106 of the brightness enhancement capacitors C06 of the red sub-pixel circuit 202, the green sub-pixel circuit 203, and the blue sub-pixel circuit 201 are required to have different shapes.

Optionally, in the display panel above according to the embodiments of the disclosure, in order to realize uniform display brightness, a capacitance difference of the brightness enhancement capacitors C06 of the red sub-pixel circuit 202, the green sub-pixel circuit 203, and the blue sub-pixel circuit 201 is less than 5% of a capacitance of any one of the brightness enhancement capacitors of the red sub-pixel circuit, the green sub-pixel circuit and the blue sub-pixel circuit.

Based upon the same inventive concept, the embodiments of the disclosure further provide a display device, including the display panel above according to the embodiments of the disclosure. The display device can be any product or component with a display function, such as a mobile phone, a tablet computer, a television, a display, a notebook computer, a digital photo frame, a navigator, and the like. As for the implementation of the display device, reference can be made to the embodiments of the above display panel, so a repeated description thereof will be omitted here.

The above serial numbers of the embodiments of the disclosure are merely for illustration, and do not represent the advantages and disadvantages of the embodiments.

The above embodiments are only alternative embodiments of the disclosure, and are not intended to limit the disclosure, and any modifications, variations, improvements, etc., which are made without departing from the spirit and scope of the disclosure, should be encompassed by the disclosure.

The invention claimed is:

1. A pixel circuit, comprising:
a light emitting device, wherein a second terminal of the light emitting device is coupled to a low voltage signal line;
a drive thin film transistor, configured to supply a drive current to the light emitting device; wherein a second terminal of the drive thin film transistor is coupled to a first terminal of the light emitting device;
a light emitting control thin film transistor, configured to control the light emitting device to emit light; wherein a first terminal of the light emitting control thin film transistor is coupled to a high voltage signal line, and a second terminal of the light emitting control thin film transistor is coupled to a first terminal of the drive thin film transistor;
a switch thin film transistor, configured to control a data voltage to be written into a control terminal of the drive thin film transistor;
a reset thin film transistor, configured to reset a potential of the control terminal of the drive thin film transistor;
a storage capacitor, wherein a first terminal of the storage capacitor is coupled to the control terminal of the drive thin film transistor, and a second terminal of the storage capacitor is coupled to the second terminal of the drive thin film transistor;
a brightness enhancement capacitor, wherein a first terminal of the brightness enhancement capacitor is coupled to the high voltage signal line, and a second terminal of the brightness enhancement capacitor is coupled to the first terminal of the light emitting device; and the brightness enhancement capacitor comprises: a first metal pattern, a second metal pattern, and a first inorganic insulation layer pattern located between the first metal pattern and the second metal pattern; wherein the first metal pattern is located above the second metal pattern.

2. The pixel circuit according to claim 1, wherein a control terminal of the light emitting control thin film transistor is coupled to a light emitting control signal line.

3. The pixel circuit according to claim 1, wherein a first terminal of the switch thin film transistor is coupled to a data signal line, a second terminal of the switch thin film transistor is coupled to the control terminal of the drive thin film transistor, and a control terminal of the switch thin film transistor is coupled to a scan signal line.

4. The pixel circuit according to claim 1, wherein a first terminal of the reset thin film transistor is coupled to an initial voltage signal line, a second terminal of the reset thin film transistor is coupled to the second terminal of the switch thin film transistor, and a control terminal of the reset thin film transistor is coupled to a reset signal line.

5. The pixel circuit according to claim 1, wherein the first terminal of the drive thin film transistor is a source or a drain; and the first terminal of the light emitting device is an anode.

6. The pixel circuit according to claim 1, wherein the brightness enhancement capacitor further comprises: a third metal pattern located below the second metal pattern, and a second inorganic insulation layer pattern located between the second metal pattern and the third metal pattern.

7. The pixel circuit according to claim 6, wherein the second metal pattern, and a source or a drain of the drive thin film transistor are at a same layer and made of a same material; and
the third metal pattern and a gate of the drive thin film transistor are at a same layer and made of a same material.

8. The pixel circuit according to claim 1, wherein the second terminal of the drive thin film transistor is coupled to the first terminal of the light emitting device through a contact hole; and a spacing between the first metal pattern and the contact hole ranges from 2 μm to 5 μm.

9. A display panel, comprising the pixel circuit according to claim 1, wherein the pixel circuit comprises a red sub-pixel circuit, a green sub-pixel circuit, and a blue sub-pixel circuit.

10. The display panel according to claim 9, wherein a capacitance difference between any two of brightness enhancement capacitors of the red sub-pixel circuit, the green sub-pixel circuit and the blue sub-pixel circuit is less than 5% of a capacitance of any one of the brightness enhancement capacitors of the red sub-pixel circuit, the green sub-pixel circuit and the blue sub-pixel circuit.

11. A display device, comprising the display panel according to claim 9.

12. The display panel according to claim 9, wherein in the red sub-pixel circuit, the green sub-pixel circuit and the blue sub-pixel circuit, contact holes, through which second terminals of drive thin film transistors are coupled to first terminals of corresponding light emitting devices, are located at different positions; and a line of centers of the contact holes is not on an imaginary line.

13. The display panel according to claim 9, wherein first terminals of brightness enhancement capacitors of the red sub-pixel circuit, the green sub-pixel circuit and the blue sub-pixel circuit are coupled to the high voltage signal line, and second terminals of the brightness enhancement capacitors of the red sub-pixel circuit, the green sub-pixel circuit and the blue sub-pixel circuit are coupled to first terminals of corresponding light emitting devices respectively.

14. The display panel according to claim 9, wherein each of brightness enhancement capacitors of the red sub-pixel circuit, the green sub-pixel circuit and the blue sub-pixel circuit comprises: a first metal pattern, a second metal pattern, and a first inorganic insulation layer pattern located between the first metal pattern and the second metal pattern; wherein the first metal pattern is located above the second metal pattern.

15. The display panel according to claim 14, wherein each of the brightness enhancement capacitors of the red sub-pixel circuit, the green sub-pixel circuit and the blue sub-pixel circuit further comprises: a third metal pattern located below the second metal pattern, and a second inorganic insulation layer pattern located between the second metal pattern and the third metal pattern.

16. The display panel according to claim 15, wherein the second metal pattern, and a source or a drain of a corresponding drive thin film transistor are at a same layer and made of a same material; and
    the third metal pattern and a gate of the corresponding drive thin film transistor are at a same layer and made of a same material.

17. The display panel according to claim 14, wherein overlapping areas of first metal patterns and second metal patterns of the brightness enhancement capacitors of the red sub-pixel circuit, the green sub-pixel circuit and the blue sub-pixel circuit are substantially same.

18. The display panel according to claim 14, wherein overlapping parts of first metal patterns and second metal patterns of the brightness enhancement capacitors of the red sub-pixel circuit, the green sub-pixel circuit and the blue sub-pixel circuit have different shapes.

\* \* \* \* \*

UNITED STATES PATENT AND TRADEMARK OFFICE
CERTIFICATE OF CORRECTION

| | | |
|---|---|---|
| PATENT NO. | : 10,978,535 B2 | Page 1 of 1 |
| APPLICATION NO. | : 16/342039 | |
| DATED | : April 13, 2021 | |
| INVENTOR(S) | : Xueguang Hao et al. | |

It is certified that error appears in the above-identified patent and that said Letters Patent is hereby corrected as shown below:

On the Title Page

The filing date of the International Application should read:
-- Aug. 30, 2018 --

Signed and Sealed this
First Day of June, 2021

Drew Hirshfeld
*Performing the Functions and Duties of the*
*Under Secretary of Commerce for Intellectual Property and*
*Director of the United States Patent and Trademark Office*